United States Patent

Kalonji et al.

[11] Patent Number: 5,808,530
[45] Date of Patent: Sep. 15, 1998

[54] MODULAR ASSEMBLY INCLUDING TWO ELECTRONIC CIRCUITS TO BE ELECTRICALLY INTERCONNECTED TO CONVEY A MICROWAVE SIGNAL

[75] Inventors: Ndiata Kalonji, Boulogne-Billancourt; Jack Semo, Palaiseau; Jacques Tanniou, Paris, all of France

[73] Assignee: France Telecom, France

[21] Appl. No.: 610,166

[22] Filed: Feb. 29, 1996

[30] Foreign Application Priority Data

Mar. 1, 1995 [FR] France .................................. 95 02356

[51] Int. Cl.⁶ .................................. H01P 5/00; H05K 5/02
[52] U.S. Cl. ........................... 333/260; 361/730; 439/581
[58] Field of Search ..................................... 333/245–247, 333/260; 385/2, 14; 361/729–731, 733, 735; 439/581, 620

[56] References Cited

U.S. PATENT DOCUMENTS

| | | | |
|---|---|---|---|
| 4,455,448 | 6/1984 | Bertolina .............................. | 333/260 X |
| 4,507,708 | 3/1985 | Lindberg .............................. | 333/260 X |
| 4,850,667 | 7/1989 | Djupsjobacka .......................... | 385/2 X |
| 4,912,715 | 3/1990 | Aoki et al. ................................. | 372/36 |
| 4,979,787 | 12/1990 | Lichtenberger ...................... | 361/730 X |

FOREIGN PATENT DOCUMENTS

| | | | |
|---|---|---|---|
| A-38 22 312 | 7/1988 | Germany .......................... | H01S 3/02 |
| WO-A-92 13369 | 1/1992 | WIPO ............................... | H01P 5/08 |

OTHER PUBLICATIONS

IEEE Transactions on Microwave Theory and Techniques, vol. 38, No. 5, May 1, 1990, pp. 518–523.
Patent Abstracts of Japan, vol. 17, No. 81, Feb. 18, 1993, p. 1.
Patent Abstracts of Japan, vol. 13, No. 51, Feb. 6, 1989, p. 1.

*Primary Examiner*—Paul Gensler
*Attorney, Agent, or Firm*—Blakely Sokoloff Taylor & Zafman

[57] ABSTRACT

The invention relates to a modular assembly comprising at least two modules to be assembled together and to be electrically interconnected when assembled for the purpose of conveying a microwave signal from an electronic circuit of one of the modules to an electronic circuit of the other module, said electronic circuits being disposed in respective packages. One of said electronic circuits includes at least one opto-electronic component that is optically connected to at least one optical fiber. Both packages are adapted to receive a microwave feedthrough having a central conductor whose axial ends come into contact with conductive tracks belonging to each of said electronic circuits, respectively.

7 Claims, 2 Drawing Sheets

MODULAR ASSEMBLY INCLUDING TWO ELECTRONIC CIRCUITS TO BE ELECTRICALLY INTERCONNECTED TO CONVEY A MICROWAVE SIGNAL

The present invention relates to the field of optoelectronics, and more precisely to a modular assembly comprising at least two modules to be assembled together and electrically interconnected to convey a signal at microwave frequency from an electronic circuit in one of the modules to an electronic circuit in the other module, one of said electronic circuits including at least one opto-electronic component that is optically connected to at least one optical fiber.

BACKGROUND OF THE INVENTION

It is conventional for opto-electronic components which are suitable for converting a light signal propagating in an optical fiber into an electrical signal, or vice versa, or which are suitable for modulating an optical signal as a function of an electrical signal, to be connected to associated components that are purely electronic. The electronic components serve to process (e.g. amplify, shape, . . . ) electrical signals coming from the opto-electronic components or to be applied thereto. In a first technological approach referred to as "monolithic", the associated electronic components may be mounted on the same support as the opto-electronic(s) with which they are connected, while in a second technological approach referred to as "modular", they are mounted on one or more separate supports.

The above-mentioned first technological approach makes it possible to take advantage of the proximity of the components for conveying electrical signals between the opto-electronic component(s) and the associated electronic components. Nevertheless, in the event of any one of the components mounted on the support failing, that technique requires the entire support and all of the components mounted thereon to be replaced. In addition, test procedures for verifying proper operation of the associated electronic components are made more difficult by the presence of optical fibers connected to the opto-electronic components, which need special precautions to be taken while the support is being handled.

The above-mentioned second technological approach seeks to remedy those drawbacks and provides a configuration in which electronic components and opto-electronic components are grouped together on respective different supports depending on the functions they perform. The opto-electronic components are grouped together on a common support to which the optical fibers are connected. Handling of the associated electronic circuits which are not connected to the optical fibers is thus made easier, and in the event of a breakdown, only the failed circuit needs to be replaced. Nevertheless, electrical connection of electronic circuits raises difficulties associated with the very high frequencies (in the microwave frequency range) of the electrical signals to be conveyed between the opto-electronic components and the associated purely electronic components which are remote therefrom.

Proposals have been made to use conductor ribbons to interconnect the various electronic circuits, once they have been placed in respective packages for protecting them mechanically and for providing electromagnetic screening. Nevertheless, the use of such ribbons does not provide complete satisfaction concerning the passband obtained.

Proposals are made in the article "A novel flip-chip interconnection technique using solder bumps for high-speed photoreceivers" published in Journal of Lightwave Technology, Vol. 8, No. 9, September 1990, to improve the passband by placing the electronic circuits to be connected face to face and by interposing conducting microspheres between them. That solution nevertheless suffers from practical difficulties for cooling the circuits, since cooling can no longer be done in conventional manner using a single solid plane formed on the face of the support opposite from the face receiving the components. In addition, placing the electronic circuits so that they face one another makes it necessary to mount them in a common package and limits accessibility to the electronic circuits.

OBJECT AND SUMMARY OF THE INVENTION

The present invention relates to the "modular" technological approach and its object is to remedy the above-specified drawbacks.

It achieves this by the fact that each module comprises a package in which an electronic circuit is placed, and each of the two packages has an opening adapted to receive a microwave feedthrough, said openings being disposed in such a manner that when the packages are assembled together, said electronic circuits are electrically connected together by said microwave feedthrough.

BRIEF DESCRIPTION OF THE DRAWINGS

Other characteristics and advantages of the present invention appear on reading the following detailed description of a non-limiting embodiment of the invention, and on examining the accompanying drawings, in which.

MORE DETAILED DESCRIPTION

Figure 1:
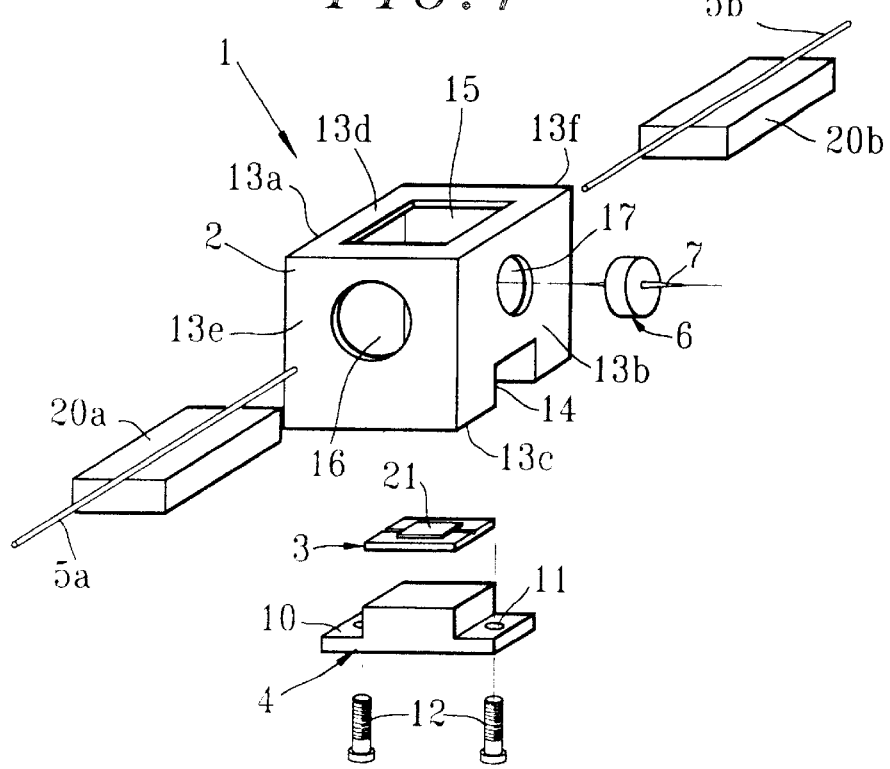
FIG. 1 is a diagrammatic exploded perspective view of a module of the invention.

FIG. 1 shows a module 1 constituting an embodiment of the invention. The module 1 comprises a hollow package 2 defining an internal housing for containing an electronic circuit 3 mounted on a base 4. The base is secured to the package 2. In the example described, the package 2 is machined from a copper cube. Two opposite external side faces of the package 2 are referenced 13a and 13b, its bottom external face is referenced 13c, its top external face is referenced 13d, and its other two opposite external side faces are referenced 13e and 13f.

In the example described, the electronic circuit 3 includes a support or a substrate (preferably made of alumina) on which electrically conductive tracks are formed and on which an opto-electronic component 21 is mounted having two opposite optical faces for connecting to two respective optical fibers 5a and 5b. Over a fraction of their respective lengths adjacent to their ends for optically connecting to the opto-electronic component, the fibers are carried by respective supports 20a and 20b that are known per se and that are shown very diagrammatically. These supports 20a and 20b are for fixing on the side faces 13e and 13f of the package 2 by welding or by adhesive. In the example described, the opto-electronic component 21 of the electronic circuit 3 connected to the fibers 5a and 5b is a conventional modulator suitable for modulating an incident optical signal fed in by the fiber 5a as a function of a received electrical signal so as to deliver a modulated lightwave to the fiber 5b. The electronic circuit 3 is electrically connected to an associated electronic circuit which is not shown in FIG. 1. According to the invention, electrical signals at a frequency lying in the range from direct current (DC) to microwave (60 GHz) are conveyed to the opto-electronic component 21 by means of a microwave feedthrough 6. In the example described, the module 1 is suitable for receiving two microwave feedthroughs. Only one microwave feedthrough is used, it is given reference 6, and it can be seen in FIG. 1.

Microwave feedthroughs are known per se since they are already used in another application on SSMA type cable connectors. In the example described, each microwave feedthrough is obtained by disassembling a connector sold by SCIEDIMES IBEXA under the reference 1052335502. The microwave feedthrough as originally to be found integrated in the connector is also commonly known as a "bead".

Figure 2:
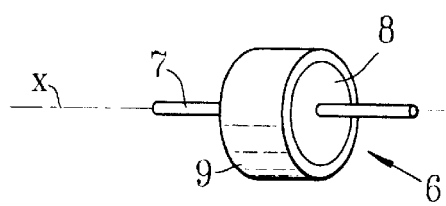
FIG. 2 is a perspective view on a larger scale showing a microwave feedthrough in isolation.

FIG. 2 shows, in isolation, a known microwave feedthrough 6 as can be recovered from a connector as mentioned above. The microwave feedthrough 6 has a rectilinear central rod 7 of circular cross-section made of an electrically conductive material and passing through a body 8 of insulating material which is in turn surrounded by a metal ring 9 for connecting to electrical ground. The conductive rod 7, the insulating body 8, and the conductive ring 9 are circularly symmetrical about a common axis of symmetry X.

Figure 3:
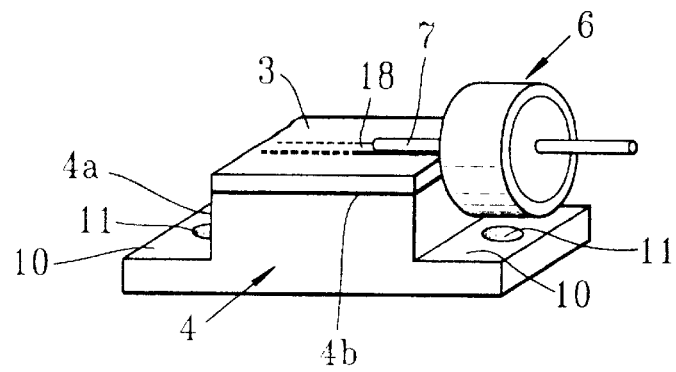
FIG. 3 is a diagrammatic perspective view showing the electrical connection between a microwave feedthrough and the electronic circuit of a module.

The base 4 shown in greater detail in FIG. 3 has a central portion 4a in the form of a rectangular block with its top face 4b receiving the electronic circuit 3, and on either side of the central portion 4a it has two fixing tabs 10 each pierced by a hole 11 for receiving a fastener 12 for fastening the base 4 to the package 2. In the example described, the fasteners are constituted by bolts for screwing into corresponding tapped holes formed in the package 2. The base 4 is mounted on the package 2 via the bottom face 13c of the package which has two notches 14 formed therein and opening out in the opposite side faces 13a and 13b to receive the fixing tabs 10 and to position the base 4 accurately relative to the package.

The top face 13d of the package 2 is provided with a window 15 giving access to the top of the electronic circuit 3 when it is inside the package 2. Two openings 16 are formed through the opposite side faces 13e and 13f of the package 2 for passing the optical fibers 5a and 5b that are to be connected to the opto-electronic component 21. In FIG. 1, only the opening 16 through side face 13e can be seen. Openings 17 are formed through the opposite side faces 13a and 13b of the package 2 for receiving microwave feedthroughs. In FIG. 1, only the opening 17 through side face 13b and receiving microwave feedthrough 6 can be seen. The above-mentioned openings 16 and 17 are circular holes passing through the side faces of the package 2 and they are placed appropriately taking account of the position of the electronic circuit 3 inside the package 2 so as to ensure that the conductive rod 7 of the microwave feedthrough 6 comes into contact with a predetermined conductive track 18 of the electronic circuit 3 after the feedthrough has been placed in the opening 17, thereby enabling the desired electrical connection to be established, and also so as to ensure that the ends of the optical fibers 5a and 5b for connection to the opto-electronic component 21 terminate in the immediate vicinity thereof with the appropriate alignment. The hole 17 has a diameter that matches the outside diameter of the ring 9.

In the example described, a conductive track 18 of the electronic circuit 3 is electrically connected to the central conductive rod of a microwave feedthrough merely by mechanical contact, with the rod 7 having its bottom generator line coming into contact with the top external surface of the track. Where necessary, the central rod 7 is stuck to the track 18 by means of an electrically-conductive adhesive, or in a variant it is soldered thereto. The access window 15 then facilitates performance of such sticking or soldering operations.

Figure 4:
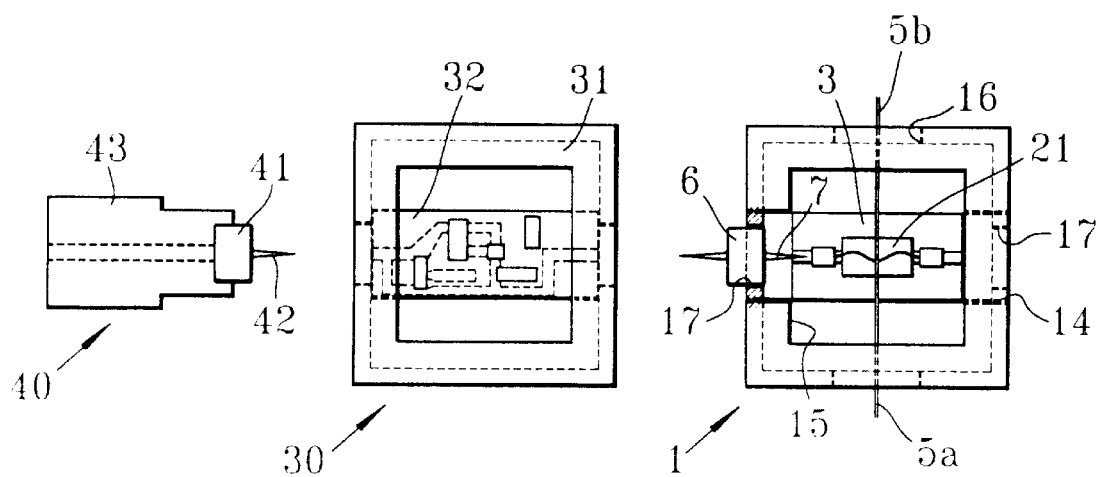
FIG. 4 is a diagrammatic plan view showing two modules and a cable connector prior to assembly.
Figure 5:
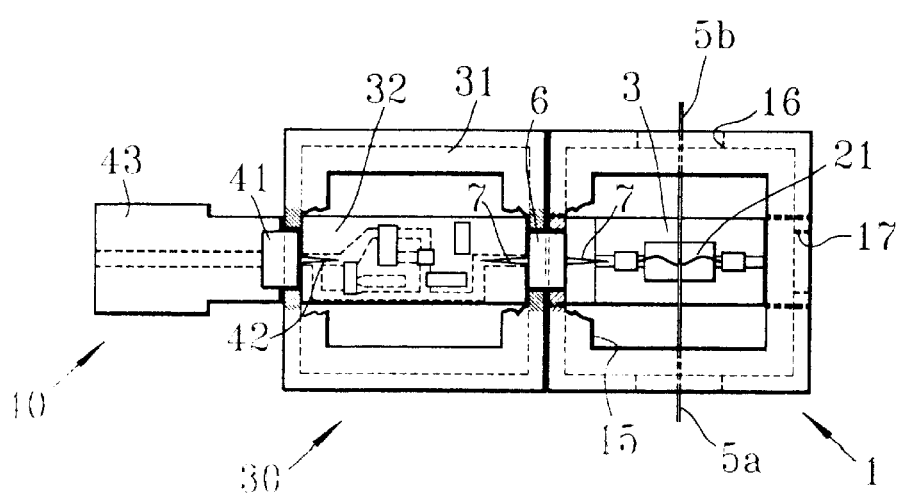
FIG. 5 is a view showing the modules and the cable connector shown in FIG. 4, but after assembly.

FIG. 4 shows the above-described module 1 for assembly with a second module 30 which itself receives an SSMA type connector 40 so as to constitute an embodiment of the modular assembly of the invention.

The module 30 includes a package 31 housing an electronic circuit 32 that has purely electronic components only, and in the example described it serves to amplify and shape the electrical signals for applying to the modulator 21 of the electronic circuit 3 of the module 1. The package 31 is identical to the above-described package 2 apart from the absence of openings 16 for passing optical fibers.

To assemble the modules 1 and 30 together, the packages 2 and 31 are placed side by side with their two facing side faces having respective openings for mounting a microwave feedthrough. The microwave feedthrough 6 is then placed in one of these openings, after which the packages 2 and 31 are moved towards each other and are assembled together by any means known to the person skilled in the art (screws, bolts, adhesive, solder, . . . ). The microwave feedthrough then electrically interconnects the electronic circuits 3 and 32, and half of it extends into each of the packages 2 and 31. The microwave feedthrough is advantageously held in place axially in the holes 17 of the packages by the ring 9 coming axially into abutment against the central rectangular block portions on the bases 4.

If necessary, the module 1 may be electrically connected to a second module via a different side face, and in the example described, the face situated remote from the module 30.

In the embodiment described, the module 30 receives an SSMA type cable connector 40 that is known per se via its side face that faces away from the module 1. The connector 40 has an external body 43 for mechanical connection with a cable at an axial end, and a "bead" 41 received in the body 43 for making electrical connection between the cable and the electronic circuit 32. The "bead" 41 has a central conductive rod 42 that comes into contact with a conductive track of the electronic circuit 32.

The connector body 40 may be releasably secured to the package 31 (e.g. by screws) or it may be permanently fastened thereto.

As an indication, the main factors guiding the person skilled in the art in selecting materials for making the package 2, the base 4, the supports 20a and 20b, and the substrate of the electronic circuit 3 are the following:

the assembly technology used for fixing the supports 20a and 20b to the package 2 (YAG laser welding, or sticking by means of an adhesive that conducts heat or electricity, . . . );

the rigidity required by the package 2 in order to enable it to withstand mechanical stresses (during and after assembly of the modules) in the environment where the modules are to be used;

electrical and thermal conductivities (in order to provide the required electromagnetic screening, sufficient heat dissipation, and the temperature regulation required by the opto-electronic component 21);

the possibility of metallizing the face of the substrate for the electronic circuit 3 that is to come into contact with the face 4b of the base 4, metallization being by depositing nickel, platinum, gold, indium, or a gold-tin alloy; and thermal expansion coefficients in order to minimize deformation of the parts that could lead to the optical fiber portions connected to the electronic circuit 3 coming out of alignment.

The package 2 is preferably made of stainless steel or of "dilver" (a known alloy mainly constituted by iron, nickel, and cobalt), thereby making it easy to fasten the supports 20a and 20b to the package 2 by YAG laser welding. The base 4 is preferably made of "dilver". In a variant, the base 4 is made of a copper and tungsten alloy or of copper.

Finally, the invention makes it possible to interconnect a plurality of electronic circuits without significant loss of passband. As an indication, a connection has been made using the invention without loss of passband up to 27 GHz (+0.5 dB). Each module also makes it possible for multiple optical and microwave electrical accesses to be provided easily.

Naturally, the invention is not limited to the embodiment described above. In particular, a plurality of openings may be formed through the same side face of a package in order to receive respective microwave feedthroughs, and it is possible to place a plurality of electronic circuits within a single package.

We claim:

1. A modular assembly comprising two assembled modules, interconnected for the purpose of conveying a microwave signal from an electronic circuit in one of the modules to an electronic circuit in the other module, one of said electronic circuits including at least one opto-electronic component that is optically connected to at least one optical fiber, each module further including a package in which the corresponding electronic circuit is placed, wherein each of the two packages has an opening receiving a microwave feedthrough, said openings facing each other and being appropriately placed relative to the electronic circuits so that said electronic circuits are electrically interconnected by said microwave feedthrough wherein each package has two openings in two respective opposite faces for mounting microwave feedthroughs in said opposite faces, and wherein the package containing the electronic circuit that incorporates at least one opto-electronic component is generally in the form of a rectangular block having two openings in two opposite side faces to receive microwave feedthroughs, and two openings through two other opposite side faces through which optical fibers connected to the opto-electronic component can pass.

2. A modular assembly according to claim 1, wherein each package has an access window in a top face providing access to the electronic circuit placed therein.

3. A modular assembly according to claim 1, wherein each package has an open bottom face for receiving a base carrying the electronic circuit to be placed inside the package.

4. A package for a modular assembly as defined in claim 1, the package having an internal housing for receiving an electronic circuit, at least one opening formed through a wall of the package for receiving a microwave feedthrough, an access window giving access to the electronic circuit, and an opening for receiving a base on which said electronic circuit is mounted.

5. A modular assembly comprising two assembled modules, interconnected for the purpose of conveying a microwave signal from an electronic circuit in one of the modules to an electronic circuit in the other module, one of said electronic circuits including at least one opto-electronic component that is optically connected to at least one optical fiber, each module further including a package in which the corresponding electronic circuit is placed, wherein each of the two packages has an opening receiving a microwave feedthrough, said openings facing each other and being appropriately placed relative to the electronic circuits so that said electronic circuits are electrically interconnected by said microwave feedthrough, and wherein each package has an access window in a top face providing access to the electronic circuit placed therein.

6. A modular assembly comprising two assembled modules, interconnected for the purpose of conveying a microwave signal from an electronic circuit in one of the modules to an electronic circuit in the other module, one of said electronic circuits including at least one opto-electronic component that is optically connected to at least one optical fiber, each module further including a package in which the corresponding electronic circuit is placed, wherein each of the two packages has an opening receiving a microwave feedthrough, said openings facing each other and being appropriately placed relative to the electronic circuits so that said electronic circuits are electrically interconnected by said microwave feedthrough and wherein each package has an open bottom face for receiving a base carrying the electronic circuit to be placed inside the package.

7. A modular assembly comprising two assembled modules, interconnected for the purpose of conveying a microwave signal from an electronic circuit in one of the modules to an electronic circuit in the other module, one of said electronic circuits including at least one opto-electronic component that is optically connected to at least one optical fiber, each module further including a package in which the corresponding electronic circuit is placed, wherein each of the two packages has an opening receiving a microwave feedthrough, said openings facing each other and being appropriately placed relative to the electronic circuits so that said electronic circuits are electrically interconnected by said microwave feedthrough, said openings having internal dimensions that match the outside dimensions of the microwave feedthrough and being coaxial with predetermined conductive tracks on the electronic circuits so that said electronic circuits are electrically interconnected by mechanical contact between the feedthrough and the conductive tracks, and wherein the feedthrough comes axially into abutment against at least one central block carrying an electronic circuit in one of the packages.

* * * * *